(12) United States Patent
Siera et al.

(10) Patent No.: US 10,408,861 B2
(45) Date of Patent: Sep. 10, 2019

(54) CIRCUIT FOR COMPENSATING AN OFFSET VOLTAGE IN AN AMPLIFIER

(71) Applicant: Rohde & Schwarz GmbH & Co. KG, Munich (DE)

(72) Inventors: Thorsten Siera, Rheinberg (DE); Reiner Franke, Velbert (DE); Oliver Coellen, Hilden (DE); Dirk Zimmermann, Munich (DE); Andre Kolbe, Coburg (DE); Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 192 days.

(21) Appl. No.: 14/802,600

(22) Filed: Jul. 17, 2015

(65) Prior Publication Data

US 2016/0258982 A1 Sep. 8, 2016

Related U.S. Application Data

(60) Provisional application No. 62/128,404, filed on Mar. 4, 2015.

(51) Int. Cl.
*G01R 1/30* (2006.01)
*H03F 1/02* (2006.01)
*G01R 1/067* (2006.01)

(52) U.S. Cl.
CPC ........... *G01R 1/30* (2013.01); *G01R 1/06766* (2013.01); *H03F 1/0211* (2013.01); *H03F 2200/228* (2013.01); *H03F 2200/261* (2013.01); *H03F 2200/375* (2013.01)

(58) Field of Classification Search
CPC ......... G01R 1/30; G01R 13/34; H03F 1/0211; H03F 2200/261; H03F 2200/228; H03F 2200/375
See application file for complete search history.

(56) References Cited

U.S. PATENT DOCUMENTS

| | | | | |
|---|---|---|---|---|
| 4,042,881 | A * | 8/1977 | Webb, Jr. | G01R 1/06766 324/115 |
| 4,403,183 | A * | 9/1983 | Lueker | G01R 13/22 324/72.5 |
| 5,777,235 | A * | 7/1998 | Altwein | G01D 3/028 73/763 |
| 7,382,166 | B1 * | 6/2008 | Ide | H03F 1/34 327/306 |
| 2005/0122164 | A1 * | 6/2005 | Brandt | H03F 1/0211 330/10 |
| 2010/0176795 | A1 * | 7/2010 | Peschke | G01R 1/30 324/121 R |

(Continued)

FOREIGN PATENT DOCUMENTS

DE 102012221132 5/2014
EP 1688478 8/2006

*Primary Examiner* — Akm Zakaria
(74) *Attorney, Agent, or Firm* — Lee & Hayes, P.C.

(57) ABSTRACT

A circuit for compensating an offset voltage in an amplifier or a DC component in a signal supplied to the amplifier comprises the amplifier and a first voltage source. The amplifier has at least one measurement signal port and at least two contacts for a supply voltage. Each of two contacts is connected to a different terminal of the first voltage source. The potential at each contact is separated from a ground potential and from an external supply potential.

11 Claims, 2 Drawing Sheets

(56) References Cited

U.S. PATENT DOCUMENTS

| | | | | |
|---|---|---|---|---|
| 2010/0283534 A1* | 11/2010 | Pierdomenico | ....... | H03F 3/4508 327/536 |
| 2012/0133430 A1* | 5/2012 | Cellier | .................... | H03F 1/305 330/69 |
| 2014/0203869 A1* | 7/2014 | Khlat | .................... | H03F 1/0227 330/75 |
| 2014/0266468 A1* | 9/2014 | Jones | .................... | H03F 1/0211 330/297 |

* cited by examiner

CIRCUIT FOR COMPENSATING AN OFFSET VOLTAGE IN AN AMPLIFIER

FIELD OF THE INVENTION

The invention relates to a circuit for compensating an offset voltage in an amplifier and/or a DC component in a signal supplied to the amplifier.

BACKGROUND OF THE INVENTION

The characteristic curve of a real differential amplifier used at the input stage of an oscilloscope conventionally is biased corresponding to the zero point. The signal at the output port of the amplifier differs from zero, if the two input ports of the amplifier are connected to ground potential. The characteristic of the real amplifier in this case corresponds to an ideal amplifier which is supplied by an offset voltage at its input. Unbalances between the transistors at the input stage of the real differential amplifier cause such an offset voltage.

For compensating such an internal offset voltage an external offset voltage with an identical absolute value and an opposite sign in comparison to the internal offset voltage can be supplied to an input port, preferably to the inverting input port, of the real differential amplifier.

Additionally, a DC signal component in the measurement signal supplied to the non-inverting input of the differential amplifier in the oscilloscope can be shifted in the display by such an external offset voltage supplied to the inverting input port.

EP 1 688 748 A1 shows a conventional circuit for supplying an external offset voltage to a differential amplifier compensating both a DC signal component in the measurement signal and an internal offset voltage.

FIG. 1 shows the main features of this state of the art. The measurement signal $V_{in}$ is supplied via a frequency dependent voltage divider comprising a parallel circuit of a resistor $R_1$ and a capacitor $C_1$ in series to a parallel circuit of a resistor $R_2$ and a capacitor $C_2$ to a non-inverting input of and differential amplifier 1. The inverting input of the differential amplifier 1 is supplied by an offset voltage $V_{offset}$ which is generated at a first terminal 2 of an adjustable offset voltage generator 3. The second terminal 4 of the adjustable offset voltage generator 3 is connected to ground. The dynamic voltage range of the signal $V_{out}$ at the output of the amplifier 1 is determined by the upper supply voltage $V_{cc}$ provided at the first terminal 5 of the upper supply voltage source 6 and the lower supply voltage $V_{ee}$ provided at the first terminal 7 of the lower supply voltage source 8. The second terminal 9 and 10 of the upper supply voltage source resp. lower supply voltage source 6 resp. 8 are each connected to ground potential.

The signal $V_{out}$ at the output of the amplifier 1 corresponds to the difference between the measurement signal $V_{in}$ amplified by the amplification factor α of the frequency dependent voltage divider and the offset voltage $V_{offset}$ according to equation (1).

$$V_{out} = \alpha \cdot V_{in} - V_{offset} \quad (1)$$

The circuit in FIG. 1 contains following disadvantages:

The measurement signal $V_{in}$ and the offset voltage $V_{offset}$ are limited by the common-mode input signal range of the differential amplifier 1. The common-mode input signal range of the differential amplifier is limited by the amplification factor of the differential amplifier and the difference between the upper supply voltage $V_{cc}$ and the lower supply voltage $V_{ee}$. Additionally, the non-linear characteristic of the differential amplifier 1 reduces the common-mode input signal range. Consequently, the limited common-mode input signal range reduces the maximum possible difference between the measurement signal $V_{in}$ and the offset voltage $V_{offset}$. Thus, arbitrarily high values for the measurement signal $V_{in}$ and for the offset voltage $V_{offset}$ cannot be realized.

The offset voltage $V_{offset}$ changes the common-mode input voltage of the differential amplifier 1 and thus shifts the measurement signal $V_{in}$ amplified by the differential amplifier in the dynamic voltage range at the output of the differential amplifier which is determined between the upper supply voltage $V_{cc}$ and the lower supply voltage $V_{ee}$. Consequently, the DC operation point of the differential amplifier is changed in direction to the non-linear characteristic of the differential amplifier resulting in a worse linear behavior. Correspondingly, classification numbers characterizing the non-linear behavior of the differential amplifier such as THD (i.e. total harmonic distortion), IP2 (i.e. intercept point second order), IP3 (i.e. intercept point third order) and so on increase.

The amplifier used for DC compensation and for internal offset voltage compensation has to be a differential amplifier. The behavior of a differential amplifier, for example the power consumption and the dynamic voltage range, is comparatively worse as a single port amplifier. For some applications a differential amplifier is thus disadvantageous.

Currents caused directly or indirectly by the external offset voltage generator can run back via signal paths in the amplifier, the connecting lines, the frequency dependent voltage divider and the DUT to the external offset voltage generator. This results in unwanted voltages across the connecting lines, the frequency dependent voltage divider and the DUT shifting the DC operation point of the differential amplifier 1 and thus producing additional noise in the output signal of the differential amplifier.

Therefore, one object of the invention is to develop a circuit for compensating both an offset voltage in an amplifier or a DC component in a signal supplied to the amplifier which overcomes the above mentioned disadvantages.

SUMMARY OF THE INVENTION

According to a first aspect of the invention, two contacts for a supply voltage at the amplifier are connected to a different terminal of a first voltage source. Hereby, these two contacts are separated from a ground potential and/or from an external supply potential. The voltage between the contact for a power supply having the higher potential and the contact for a power supply having the lower potential corresponds to the voltage generated by the first voltage source.

Preferably, the measurement signal is inventively positioned in the mean of the dynamic voltage range at the output of the amplifier, i.e. the optimal operating point in the center of the linear range of the amplifier.

In a preferred first inventive variant the first voltage source is a battery. The battery does not have any reference to a ground potential or to an external supply potential and only delivers a non-referenced between its both terminals.

In a preferred second inventive variant the first voltage source is a voltage which is provided by an AC power supply via a transformer and a succeeding rectifier circuit. The transformer does not have any reference to a ground potential or to an external supply potential.

In a first embodiment of the invention the two contacts for a power supply are galvanically separated from a ground potential and/or from an external supply potential. Thus the value of the potential at both contacts floats and is not referenced to a ground potential and also not to an external reference potential.

Preferably, the amplified measurement signal is inventively positioned in the mean of the dynamic voltage range at the output of the amplifier, i.e. in the optimal operating point in the center of the linear range of the amplifier. The dynamic voltage range at the output of the amplifier does not have any reference and floats. The output signal contains the amplified measurement signal with compensated offset voltage in the amplifier and/or compensated DC component.

In a second embodiment of the invention a second power source providing the offset voltage of the amplifier and/or the DC component in the measurement signal is added to the circuit. Hereby, the contact for a supply voltage of the amplifier, which has the lower potential, is additionally connected to a first terminal of the second voltage source, whose second terminal can be connected to the ground potential.

Consequently, in the second embodiment of the invention the mean in the dynamic voltage range at the output of the amplifier has a potential which corresponds to the offset voltage in the amplifier and/or the DC component in the measurement signal plus half of the voltage provided by the first voltage source. Thus, the amplified measurement signal is positioned in the mean of the dynamic voltage range at the output of the amplifier, i.e. in the optimal operating point in the center of the linear range of the amplifier. The output signal of the amplifier contains the amplified measurement signal with compensated offset voltage and/or compensated DC component.

In a third embodiment of the invention a second power source providing a summed voltage of the offset voltage in the amplifier and/or of the DC component in the measurement signal and the voltage providing by the first power source is also added to the circuit. Hereby, in contrast to the first embodiment, the contact for a supply voltage of the amplifier which has a higher potential is additionally connected to a first terminal of the second voltage source, whose second terminal can be connected to the ground potential.

Consequently, in the third embodiment of the invention the mean in the dynamic voltage range at the output of the amplifier corresponds to the offset voltage in the amplifier and/or the DC component in the measurement signal plus half of the voltage delivered by the first voltage source. Thus, the amplified measurement signal is positioned in the mean of the dynamic voltage range at the output of the amplifier, i.e. in the optimal operating point in the center of the linear range of the amplifier. The output signal of the amplifier contains the amplified measurement signal with compensated offset voltage and/or compensated DC component.

According to another inventive aspect, the circuit for compensating an offset voltage in an amplifier and/or a DC component in a signal supplied to the amplifier can be used for each input port of an oscilloscope. Hereby, each input port of the oscilloscope is the measurement signal port in the inventive circuit.

Furthermore, the inventive circuit for compensating an offset voltage in an amplifier and/or a DC component in a signal supplied to the amplifier can be used for the signal measured at the tip of a probe. Hereby, the tip of the probe is connected to the measurement signal port in the inventive circuit.

BRIEF DESCRIPTION OF THE DRAWINGS

In the following, the invention is described on the basis of the drawings which present advantageous exemplary embodiments of the invention by way of example only. The drawings show.

DETAILED DESCRIPTION OF THE DRAWING

In the following the embodiments of the invention and additional inventive variants are described in detail with reference to FIGS. 2A, 2B, 3 and 4.

Figure 1:
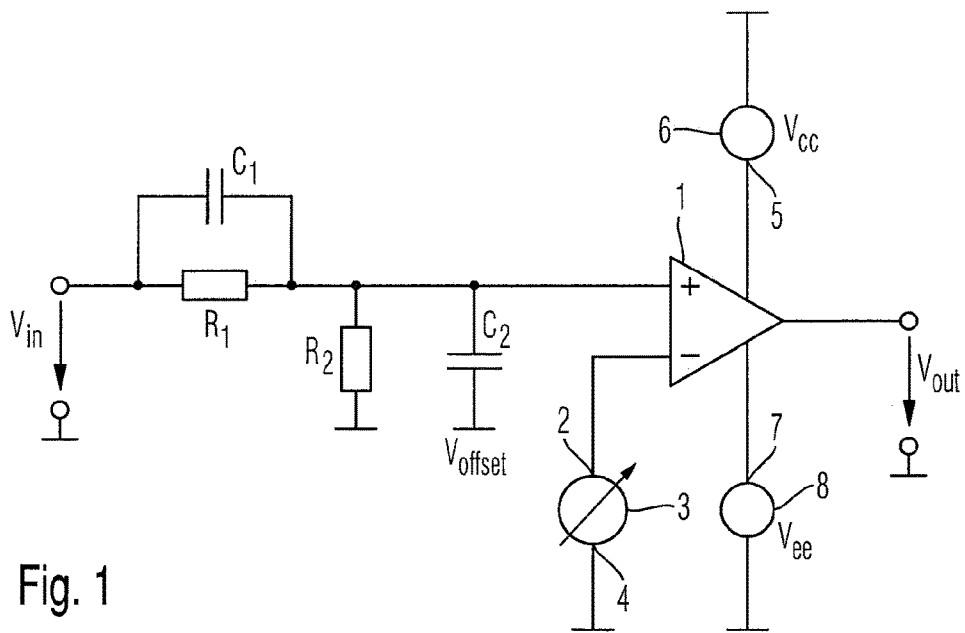
FIG. 1 a circuit diagram with a circuit for compensating an offset voltage in an amplifier and/or a DC component in a signal supplied to the amplifier according to the state of the art, FIG. 2A a circuit diagram with a first variant of a first embodiment of an inventive circuit for compensating an offset voltage in an amplifier and/or a DC component in a signal supplied to the amplifier, FIG. 2B a circuit diagram with a second variant of a first embodiment of an inventive circuit for compensating an offset voltage in an amplifier and/or a DC component in a signal supplied to the amplifier, FIG. 3 a circuit diagram with a second embodiment of an inventive circuit for compensating an offset voltage in an amplifier and/or a DC component in a signal supplied to the amplifier and FIG. 4 a circuit diagram with a third embodiment of an inventive circuit for compensating an offset voltage in an amplifier and/or a DC component in a signal supplied to the amplifier.
Figure 2A:
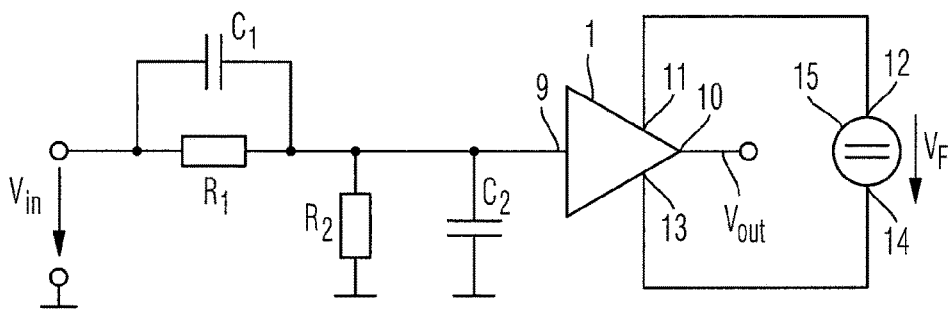
Figure 2B:
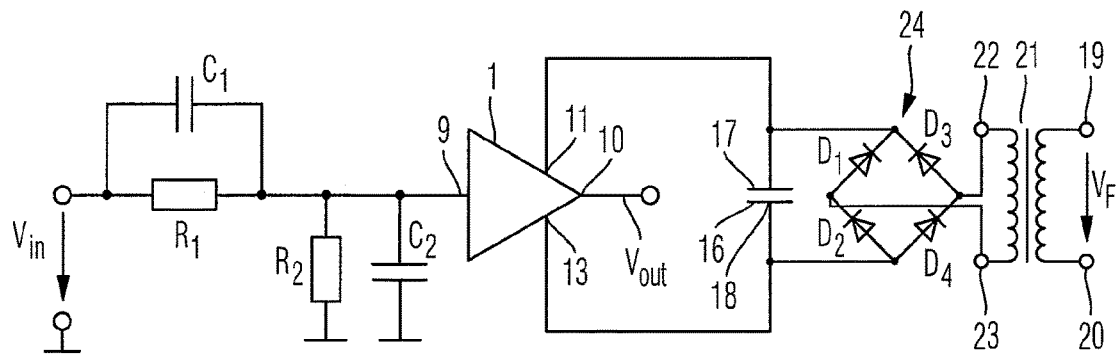
Figure 3:
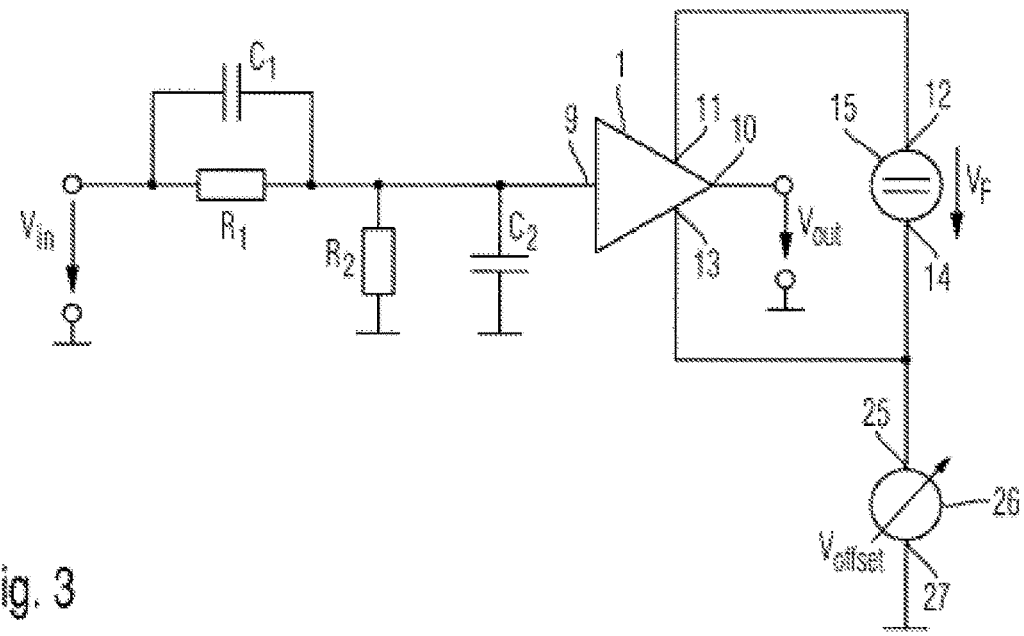
Figure 4:
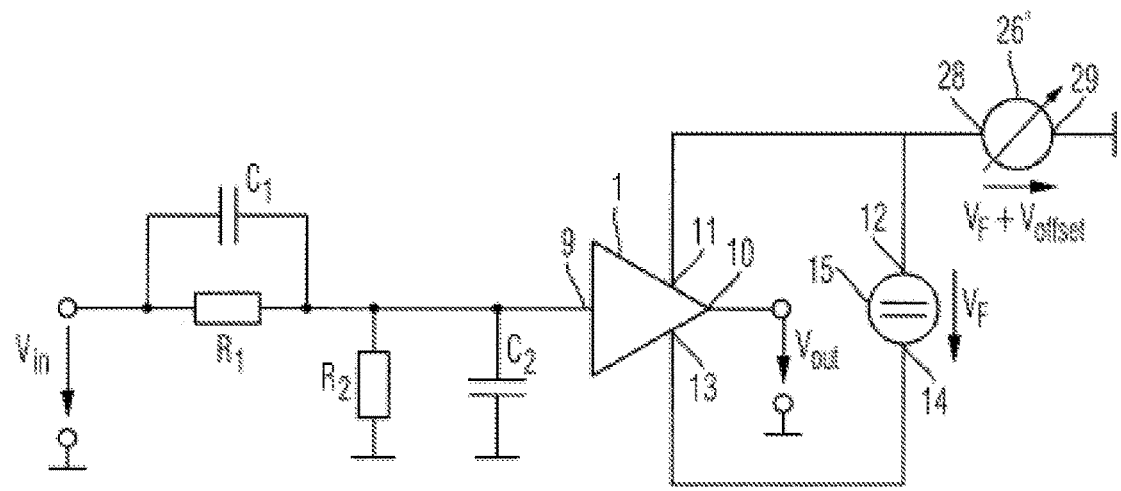

In the first variant of the first embodiment of the inventive circuit for compensating an offset voltage in an amplifier and/or a DC component in a signal supplied to the amplifier shown in FIG. 2A and in the other inventive variants and inventive embodiments shown in FIGS. 2B, 3 and 4 a single input port amplifier 1 for amplifying a common-mode measurement signal $V_{in}$ at the input of the inventive circuit is used. Alternatively, a differential amplifier for amplifying a common-mode measurement signal $V_{in}$ or a differential measurement signal can also be used and is thus within the scope of the invention.

The common-mode measurement signal $V_{in}$ is referenced to a ground potential which represents the common ground potential. The voltage level of the measurement signal $V_{in}$ is provided through in a frequency dependent voltage divider comprising a parallel circuit of a resistor $R_1$ and a capacitor $C_1$ in series to a parallel circuit of a resistor $R_2$ and a capacitor $C_2$. The measurement signal is fed to an input port 9 of the amplifier 1. After amplification of the attenuated measurement signal a signal $V_{out}$ is generated at the output port 10 of the amplifier 1.

The total dynamic voltage range of the output signal $V_{out}$ of the amplifier 1 is dependent on the voltage supplied between the contacts for a supply voltage 11 and 13 of amplifier 1. Each contact for a supply voltage 11 and 13 in the amplifier 1 is connected to a different terminal 12 and 14 of a first voltage source 15 generating a DC voltage $V_F$. The total dynamic voltage range at the output 10 of the amplifier 1 depends on this voltage $V_F$.

The first voltage source 15 in the first variant of the first embodiment is realized as a battery. Both terminals 12 and 14 of the battery and consequently both contacts for a supply voltage 11 and 13 of the amplifier 1 are not referenced to the common ground potential and also not to an external supply potential and are thus float.

Consequently, the amplified measurement signal $V_{out}$ is positioned in the mean of the dynamic voltage range at the output 10 of the amplifier 1, i.e. in the optimal operating point in the center of the linear range of the amplifier. The AC component of the amplified measurement signal is now completely within the total dynamic voltage range at the output 10 of the amplifier 1. Thus, a DC component of the measurement signal and an internal offset voltage of the amplifier 1 are no more present in the amplified measurement signal. This means that the amplified measurement signal is cleared from the DC component of the measurement signal and from an internal offset voltage of the amplifier 1.

In a second variant of the first embodiment of the invention shown in FIG. 2B the two contacts 11 and 13 for a supply voltage are connected to corresponding contacts 17 and 18 of capacitor 16. The voltage across the capacitor 16, which defines the total dynamic voltage range at the output 10 of the amplifier 1, is provided by an AC voltage $V_F$ between the two input ports 19 and 20 of a transformer 21. The transformed AC voltage $V_F$ at the output ports 22 and 23 of the transformer 21 are fed via a succeeding rectifier circuit 24 being a Graetz circuit comprising four rectifying diodes $D_1$, $D_2$, $D_3$ and $D_4$ for rectifying the transformed AC voltage to a corresponding DC voltage $V_F$ to the both contacts 17 and 18 of the capacitor 16.

The voltage across the capacitor 16 does not have any reference to the common ground potential and to an external supply potential, because secondary side of the transformer 21 is not referenced to any reference potential.

Equivalently to the first inventive variant in FIG. 2A, both contacts for a supply voltage 11 and 13 of the amplifier 1 in the second inventive variant in FIG. 2B are not referenced to the common ground potential and also not to an external supply potential and are thus float. Consequently, the amplified measurement signal $V_{out}$ is positioned in the mean of the dynamic voltage range at the output 10 of the amplifier 1, i.e. in the optimal operating point in the center of the linear range of the amplifier. The signal at the output 10 of the amplifier 1 contains only the AC component of the amplified measurement signal. Thus the amplified measurement signal is cleared from the DC component of the measurement signal and from an internal offset voltage of the amplifier 1.

In the second embodiment of the invention shown in FIG. 3 the contact for a supply voltage 13 having a lower potential is additionally connected to the first terminal 25 of a second voltage source 26, whereas the second terminal 27 of the second voltage source 26 is connected to the common ground potential. The second voltage source 26 represents a voltage source with adjustable voltage level for compensating the DC component of the measurement signal and the internal offset voltage in the amplifier 1 at the output 10 of the amplifier 1. Consequently, the voltage level to be adjusted at the second voltage source 26 corresponds to the DC component of the measurement signal and to the internal offset voltage in the amplifier 1.

Consequently, the mean of the dynamic voltage range at the output 10 of the amplifier 1 corresponds to the sum of the DC component of the measurement signal and the internal offset voltage in the amplifier 1 plus half of the voltage generated by the first voltage source 15. The total dynamic voltage range at the output 10 of the amplifier 1 covers only the AC component of the amplified measurement signal. Thus the amplified measurement signal is cleared from the DC component of the measurement signal and from an internal offset voltage in the amplifier 1.

In the third embodiment of the invention shown in FIG. 4 the contact for a supply voltage 11 having a higher potential is additionally connected to the first terminal 28 of a second voltage source 26', whereas the second terminal 29 of the second voltage source 26' is connected to the common ground potential. The second voltage source 26' also represents a voltage source with adjustable voltage level for compensating the DC component of the measurement signal and the internal offset voltage in the amplifier 1 at the output 10 of the amplifier 1.

Consequently, the voltage level to be adjusted at the second voltage source 26' corresponds to sum of the voltage $V_F$ provided by the first voltage source 15 plus the DC component of the measurement signal and the internal offset voltage in the amplifier 1.

Consequently, the mean of the dynamic voltage range at the output 10 of the amplifier 1 corresponds to the sum of the DC component of the measurement signal and the internal offset voltage in the amplifier 1 plus half of the voltage generated by the first voltage source 15. In other words the mean of the dynamic voltage range is the voltage generated by the second voltage source 26 minus half of the voltage generated by the first voltage source 15. The total dynamic voltage range at the output 10 of the amplifier 1 covers only the AC component of the amplified measurement signal. Thus the amplified measurement signal is cleared from the DC component of the measurement signal and from an internal offset voltage in the amplifier 1.

The invention is not restricted to the exemplary embodiments and exemplary variants. Advantageously, all the features described above or features shown in the figures of the drawing or features claimed in all the claims can be combined with one another arbitrarily within the scope of the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A circuit for compensating an offset voltage in an amplifier or a DC component of a signal supplied to the amplifier, wherein the circuit comprises the amplifier and a first voltage source, wherein the amplifier has at least one measurement signal port and at least two power supply contacts for a supply voltage, wherein a dynamic voltage range at an output port of the amplifier has a potential which corresponds to the offset voltage or to the DC component of a measurement signal supplied to the measurement signal port plus half of voltage provided by the first voltage source, wherein each of the at least two power supply contacts is connected to a different terminal of the first voltage source, wherein each of the at least two power supply contacts is separated from a ground potential, wherein each of the at least two power supply contacts is also separated from any external supply potential, and wherein a potential at each of the at least two power supply contacts floats.

2. The circuit according to claim 1,
wherein an amplified measurement signal is positioned at a mean in the dynamic voltage range at the output port of the amplifier.

3. The circuit according to claim 1,
wherein the potential at each of the at least two power supply contacts is galvanically separated from a ground potential or from every external supply potential.

4. The circuit according to claim 1,
wherein a contact of the at least two power supply contacts of the amplifier having a lower potential is additionally connected to a first terminal of a second voltage source,
wherein a second terminal of the second voltage source is connected to the ground potential.

5. The circuit according to claim 4,
wherein the second voltage source provides a voltage equivalent to the offset voltage or the DC component of the measurement signal supplied to the measurement signal port.

6. The circuit according to claim 1,
wherein a contact of the at least two power supply contacts of the amplifier having a higher potential is additionally connected to a first terminal of a second voltage source,
wherein a second terminal of the second voltage source is connected to the ground potential.

7. The circuit according to claim 6,
wherein the second voltage source provides a sum of the offset voltage or of the DC component of the measurement signal supplied to the measurement port and of the voltage provided by the first voltage source.

8. The circuit according to claim 1,
wherein the first voltage source is a battery.

9. The circuit according to claim 1,
wherein the first voltage source is a voltage provided by AC voltage source via a transformer and a succeeding rectifying circuit.

10. An oscilloscope having at least one input port, whereby each input port is a measurement signal port in a circuit according to claim 1.

11. A probe having a tip, which is connected to a measurement signal port of a circuit according to claim 1.

* * * * *